United States Patent [19]

Liu et al.

[11] Patent Number: 5,399,312
[45] Date of Patent: Mar. 21, 1995

[54] METHOD FOR FABRICATING HIGH-JC THALLIUM-BASED SUPERCONDUCTING TAPE

[75] Inventors: Ru-Shi Liu; Sheng-Feng Wu; Chung-Ho Tai; Der-Shiuh Shy, all of Hsinchu,

[73] Assignee: Industrial Technology Research Institute, Hsinchu,

[21] Appl. No.: 131,471

[22] Filed: Oct. 4, 1993

[51] Int. Cl.$^6$ .................... B22F 7/00; H01B 12/00
[52] U.S. Cl. ......................... 419/54; 419/8; 419/20; 419/21; 419/22; 419/41; 419/43; 505/501; 505/430
[58] Field of Search .................. 419/5, 8, 10, 22, 30, 419/38, 43, 44, 53, 54; 505/430, 433, 434, 500, 501

[56] References Cited

U.S. PATENT DOCUMENTS

| | | | |
|---|---|---|---|
| 5,210,069 | 5/1993 | Chiang | 505/1 |
| 5,242,897 | 9/1993 | Wong et al. | 505/1 |
| 5,262,391 | 11/1993 | Morita et al. | 505/1 |
| 5,268,354 | 12/1993 | Blanchet-Fincher | 505/1 |
| 5,300,482 | 4/1994 | Doi et al. | 505/120 |
| 5,318,948 | 6/1994 | Okada et al. | 505/230 |
| 5,332,721 | 7/1994 | Xin et al. | 505/492 |

Primary Examiner—Donald P. Walsh
Assistant Examiner—John N. Greaves
Attorney, Agent, or Firm—W. Wayne Liauh

[57] ABSTRACT

A process for fabricating Thallium-based superconducting tapes comprising the steps of: (1) preparing a powder mixture having a nominal composition of $(Tl_{1-x-y}Bi_yPb_z)(Ba_{2-z}Sr_z)Ca_2Cu_3O_9$; (2) placing the powder mixture into a silver tube and drawing and/or swaging the silver tube containing the powder mixture into a wire having a pre-determined diameter, wherein x and y are real numbers between 0.2 and 0.4, and z is a real number between 0 and 2; (3) rolling the wire into a tape having a pre-determined thickness; and (4) subjecting the tape to a two-stage single-sintering process at two respective sintering temperatures. The two-stage single-sintering process of the present invention allows Thallium-based superconducting tapes to be fabricated which exhibit substantially increased critical current density, without causing a substantially increased cost and complexity, as do other prior art processes, such as the double-sintering process.

8 Claims, 5 Drawing Sheets

METHOD FOR FABRICATING HIGH-JC THALLIUM-BASED SUPERCONDUCTING TAPE

FIELD OF THE INVENTION

This invention relates to a method for fabricating High-$J_c$ thallium-based superconducting tape. More particularly, this invention relates to a method for fabricating superconducting tapes from Tl-1223 materials, such as $(Tl_{1-x-y}Bi_yPb_z)Ba_2Ca_2Cu_3O_z$, $(Tl_{1-x}Bi_x)Sr_2Ca_2Cu_3O_y$, $(Tl_{1-x-y}Bi_xPb_y)Sr_2Ca_2Cu_3O_z$, $TlBa_2Ca_2Cu_3O_y$, $(Tl_{0.5}Pb_{0.5})(Ba_{0.4}Sr_{1.6})Ca_2Cu_3O_y$, $(Tl_{0.5}Pb_{0.5})Sr_2Ca_2Cu_3O_y$, etc, with improved critical current density, $J_c$.

BACKGROUND OF THE INVENTION

In 1991, one of the co-inventors of the present invention, R. S. Liu, and his co-workers observed that bar shaped (1.5×2×10 mm) single polycrystalline phase samples of $(Tl_{0.5}Pb_{0.5})Sr_2Ca_2Cu_3O_9$ exhibited a high critical current density. Based on magnetic-hyteresis measurements, they reported that $(Tl_{0.5}Pb_{0.5})Sr_2Ca_2Cu_3O_9$ showed a critical current density, or $J_c$ of $1.24 \times 10^5$ A/cm², when measured at a temperature of 77K and a magnetic field of 1 T (telsa). This value of critical current density is comparable to that measured from $YBa_2Cu_2O_7$ ($1.04 \times 10^5$ A/cm²) but considerably greater than the value measured for $Tl_2Ba_2Ca_2Cu_3O_{10}$, a Tl-2223 material. This observation has been subsequently reported and/or cited in a number of technical publications. See, e.g., "High critical-current densities in $(Tl_{0.5}Pb_{0.5})Sr_2Ca_2Cu_3O_9$ with $T_c$ up to 115K," R. S. Liu, et al., Appl. Phys. Lett., Vol 60, No. 8, February 1992, pp. 1019–1021. See also, "Optimisation of thallium '1223' high-temperature superconducting wire by a single-stage cold deformation process," B. A. Glowacki et al., PHYSICA C, 200, 1992, pp. 140–146; and "Development of Tl-1223 superconducting tapes," D. E. Peterson, et al., PHYSICA C, 199, 1992, pp. 161–170.

Other researchers also reported the high critical current density of Tl-1223 superconducting material. Matsuda, et al, prepared bulk samples consisting of (Tl/Pb)—(Sr/Ba)—Ca—Cu—O with a nominal composition of (1223). The Tl/Pb ratio was 0.5/0.5~0.8/0.2, and the Sr/Ba ratio was 0.9/0.1~0.6/0.4. Their procedure is summarized below:

Mixing (SrO, BaO, CaO, CuO)⇒Calcination (@870° C., 20 hours)
⇒Mixing ($Tl_2O_3$, PbO)⇒Pelletizing (30 mm diameter)
⇒Sintering (800°~900° C., 10 hours)⇒Grinding and Pelletizing
⇒Partial Melting (@900°~1,100° C., 10~120 min.)
⇒Annealing (@850°~880° C., 10~50 hours)

They calculated the intra-grain critical current density to be 18,000 A/cm² at 77K and 1 T. Using a drawing-rolling method, Matsuda, et al, also fabricated a tape-shaped wire with Au—Pd sheath and the Tl-1223 core prepared above. The critical current density for the Tl-1223 tape was measured to be about 500 A/cm² at 77K and 1 T.

The high critical current density of the Tl-1223 superconducting material in the presence of a magnetic field (about or greater than 1 T) had been attributed, at least in part, to the pinning centers that were introduced into the bulk material in melt form. By comparing the critical current density of $(Tl_{0.5}Pb_{0.5})Sr_2Ca_2Cu_3O_9$ with those of Bi- and Tl-2212 and 2223 [e.g., (Bi or Tl)$_2$(Sr or Ba)$_2$CaCu$_2$O$_8$ and (Bi or Tl)$_2$(Sr or Ba)$_2$Ca$_2$Cu$_3$O$_{10}$] compounds, Liu, et al. (ibid) concluded that the high critical density of $(Tl_{0.5}Pb_{0.5})Sr_2Ca_2Cu_3O_9$ could also be attributed to the three-dimensional character thereof due to the enhancement of the superconducting coupling along the c-axis between the Cu—O planes resulting in an increase in the critical current density relative to the two-dimensional Bi- and Tl-2212 and 2223 compounds. Kim, et al. proposed an exponential dependence for the Josephson tunneling between the conducting Cu—O layers with the interlayer spacing for various high temperature superconducting materials. In the crystalline structure of Tl-1223 (or Tl1212) compound, the two adjacent CU—O layers are separated by a single Tl—O insulating layer; and the distance between two adjacent CU—O layers is 8.72 Å. This distance is very similar to that in $YBa_2Cu_3O_7$ (YBCO). The small distance between the CU—O conducting planes in Tl1223 and YBCO may have allowed the Josephson interlayer coupling to be short-circuited thus enabling both Tl-1223 and YBCO conducting materials to achieve high critical current densities. However, the Tl-1223 material has an inherent advantage over either Tl-1212 or YBCO, in that the Tl-1223 material has a substantially higher To relative to either Tl-1212 or YBCO. The fabrication of Tl-1223 into practical embodiments, such as conducting tapes, therefore has generated great interest in the applications of superconducting materials.

As mentioned above, Matsuda, et al, used a drawing-rolling method to fabricate a tape-shaped wire with Au—Pd sheath and a Tl-1223 core therein; the critical current density for the Tl-1223 tape was measured to be about 500 A/cm² at 77K. Typically, the superconducting tapes are fabricated using a process by which superconducting powder is loaded into a silver tube, which is then subject to a swaging or drawing step, followed by a rolling and/or pressing step, and finally a sintering step. The critical current density for a sintered Tl-1223 tape was measured to be about 6,200 A/cm², at 75K. See, "Development of Tl-1223 superconducting tapes," D. E. Peterson, et al., PHYSICA C, 199, 1992, pp. 161–170. Conventionally, the Tl-1223 tape was sintered at a sintering temperature of 800°~900° C. for 1~12 hours, following the rolling or pressing step. To improve its critical current density, the sintered Tl-1223 tape can be subject to a post-sintering pressing process. This typically increases the critical current density of a Tl-1223 tape to about 10,000 A/cm² (@77K and 1 μV/cm). Another method to improve the critical current density of a Tl-1223 tape is to employ a double-sintering technique. This technique was disclosed by Y. Torri in Eur. Pat. App. No 91104796.7. In the double-sintering process disclosed by Y. Torri, et al., the Tl-1223 tape, after being pressed or rolled, was sintered at 800° C. for one hour, then pressed and again sintered at 840° C. for four more hours. The critical current density of a Tl-1223 tape after the double-sintering process disclosed by Torri can be increased to above 10,000 A/cm² (@77K and 1 μV/cm).

Because of its high critical temperature and inherent critical current density, Tl-1223 superconducting material presents a very promising potential for practical applications. However, the Tl-1223 tapes exhibit disappointingly low critical current density when fabricated using conventional technique. On the other hand, the double-sintering technique, which could more than double the critical current density of the Tl-1223 tapes relative to those fabricated using conventional processes, is too expensive and time-consuming. Therefore, it is highly desirable to develop a new technique which could similarly improve the critical current density of Tl-1223 tapes with minimum modification of fabrication facility and minimum additional cost.

SUMMARY OF THE INVENTION

Having discussed the commercial potential of the Tl-1223 superconducting materials and the disadvantages of the prior art processes to fabricate superconducting tapes therefrom with high critical current density, the primary object of the present invention is, therefore, to develop a process, by which high critical current density Tl-1223 superconducting tapes can be economically and efficiently fabricated. More particularly, the primary object of the present invention is to develop a two-stage single-sintering process for fabricating superconducting Tl-1223 materials into superconducting tapes which provide a critical current density at least twice as much as those fabricated using conventional processes; however, it does not require the expensive and time-consuming double-sintering step disclosed in the prior art.

In a preferred embodiment of the present invention, the method for fabricating Tl-based superconducting tape comprises the following steps:

(a) preparing a powder mixture having a nominal composition of $(Tl_{1-x-y}Bi_yPb_z)(Ba_{2-z}Sr_z)Ca_2Cu_3O_9$;

(b) placing said powder mixture into a silver tube and drawing and/or swaging said silver tube containing said powder mixture into a wire having a predetermined diameter, wherein x and y are real numbers between 0.2 and 0.4, and z is a real number between 0 and 2;

(c) rolling said wire into a tape having a pre-determined thickness;

(d) subjecting said tape to a two-stage one-sintering process, said two-stage one-sintering process comprising a first stage at first sintering temperature, a second stage at a second sintering temperature, and a temperature ramp between said first and second temperatures.

The superconducting tapes fabricated using the two-stage single-sintering process disclosed in the present invention exhibits a critical current density from about 10,000 A/cm$^2$ to about 13,300 A/cm$^2$ (measured at 77K and 1 $\mu$V/cm). A variety of Tl-based superconducting materials, including $(Tl_{1-x-y}Bi_yPb_z)Ba_2Ca_2Cu_3O_z$, $(Tl_{1-x}Bi_x)Sr_2Ca_2Cu_3O_y$, $(Tl_{1-x-y}Bi_xPb_y)Sr_2Ca_2Cu_3O_z$, $TlBa_2Ca_2Cu_3O_y$, $(Tl_{0.5}Pb_{0.5})(Ba_{0.4}Sr_{1.6})Ca_2Cu_3O_y$, $(Tl_{0.5}Pb_{0.5})Sr_2Ca_2Cu_3O_y$, etc, can be fabricated using the process of the present invention. The process disclosed in the present invention is particularly suitable for fabricating $(Tl, Pb, Bi)(Sr, Ba)_2C_2Cu_3O_y$ superconducting tapes.

BRIEF DESCRIPTION OF THE DRAWINGS

The present invention will be described in detail with reference to drawings showing the preferred embodiment of the present invention, wherein.

DETAILED DESCRIPTION OF PREFERRED EMBODIMENT

The present invention will now be described more specifically with reference to the following examples. It is to be noted that the following descriptions of examples including preferred embodiments of this invention are presented herein for purpose of illustration and description; it is not intended to be exhaustive or to limit the invention to the precise form disclosed.

EXAMPLE 1

Preparation of $(Tl, Pb, Bi)(Sr, Ba)_2Ca_2Cu_3O_y$

A mixture of $SrCO_3$, $BaCO_3$ $CaCO_3$, and $CuO$ were prepared in a molar ratio of Sr:Ba:Ca:Cu=1.2~1.9:0.8~0.1:2:3. The mixture was thoroughly mixed and sintered at 920° C. for 10 hours to form precursor powders.

These precursor powders were then mixed with a mixture containing $Tl_2O_3$, PbO, and $Bi_2O_4$ by grinding with a mortar and pestle. The powder mixture had a nominal composition of $(Tl_{0.4\sim0.6}Bi_{0.2\sim0.4}Pb_{0.2\sim0.4})Sr_{1.2\sim1.7}Ba_{0.8\sim0.3}Ca_2Cu_3O_y$ (i.e., the molar ratio among the atoms of Tl:Bi:Pb:Sr:Ba:Ca:-
Cu=0.4~0.6:0.2~0.4:0.2~0.4:1.2~1.9:0.8~0.1:2:3).
The powder was placed in a gold box (in order to prevent the evaporation of thallium in the form of $Tl_2O$ vapor at temperatures greater than 800° C.), sintered at 920° C. in an oxygen environment for 3~5 hours, then cooled to room temperature at a rate of 2° C. per minute. This resulted in a (Tl, Pb, Bi)(Sr, Ba)$_2C_2Cu_3O_y$ powder.

EXAMPLE 2

Preparation of (Tl, Pb, Bi)(Sr, Ba)$_2Ca_2Cu_3O_y$ Tapes:

The (Tl, Pb, Bi)(Sr, Ba)$_2Ca_2Cu_3O_y$ powder prepared from Example 1 was ground with a mortar and pestle, and loaded into a silver tube having an outer diameter of 6 mm and an inner diameter of 4 mm. The tube assembly was swaged and drawn to form a wire having an outer diameter of about 1.5 min. The resulting wire was formed into a tape having a thickness of about 0.15 mm by rolling, and optionally by pressing at 200 Kg/m$^2$ to a thickness of 0.08 mm.

EXAMPLE 3

Fabrication of (Tl, Pb, Bi)(Sr, Ba)$_2Ca_2Cu_3O_y$ (Represented as Tl-1223) Tapes Using a Single-Stage Single-Sintering Process at 880° C.

Figure 1A:
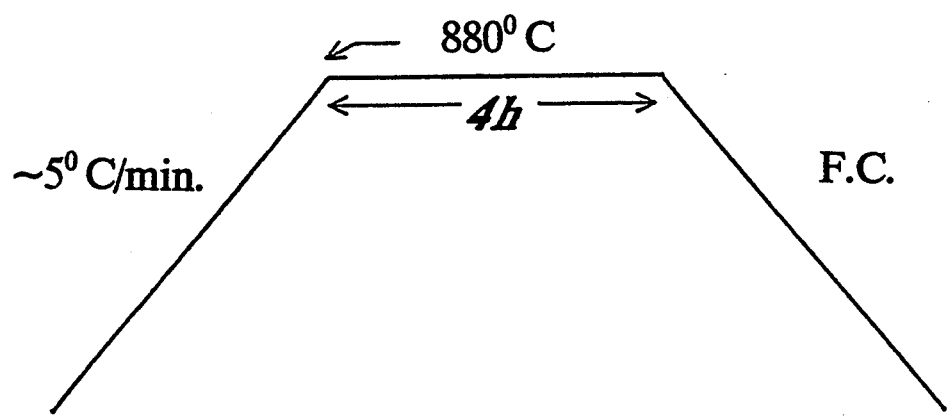
FIG. 1A shows the sintering temperature-time relationship in a single-stage, single-sintering process for fabricating Tl-1223 superconducting tapes; initially the furnace temperature increased at a rate of about 5° C. per minute to 880° C., maintained at 880° C. for 4 hours, then furnace-cooled to room temperature.
Figure 1B:
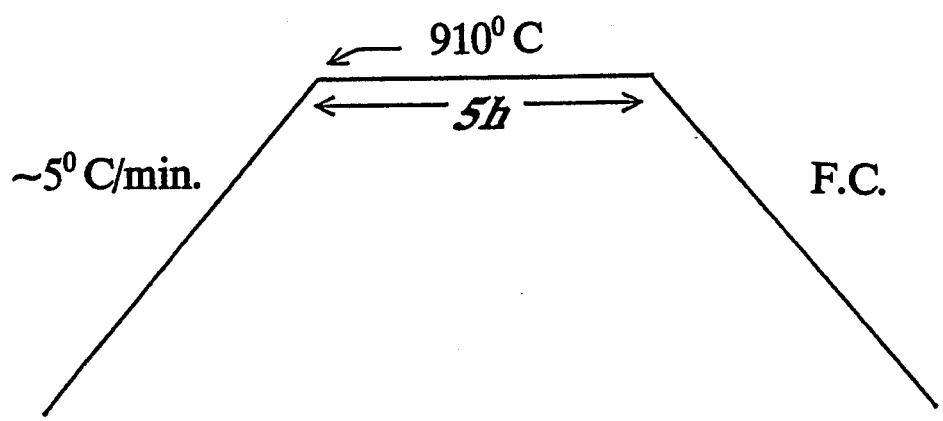
FIG. 1B shows the sintering temperature-time relationship in another single-stage, single-sintering process for fabricating Tl-1223 superconducting tapes; initially the furnace temperature increased at a rate of about 5° C. per minute to 910° C., maintained at 910° C. for 5 hours, then furnace-cooled to room temperature.

The (Tl, Pb, Bi)(Sr, Ba)$_2Ca_2Cu_3O_y$ prepared from Example 2 was sintered using a single-stage single-sintering process as illustrated in FIG. 1A; initially the furnace temperature increased at a rate of about 5° C. per minute to 880° C., maintained at 880° C. for 4 hours, then was furnace-cooled to room temperature.

Figure 3:
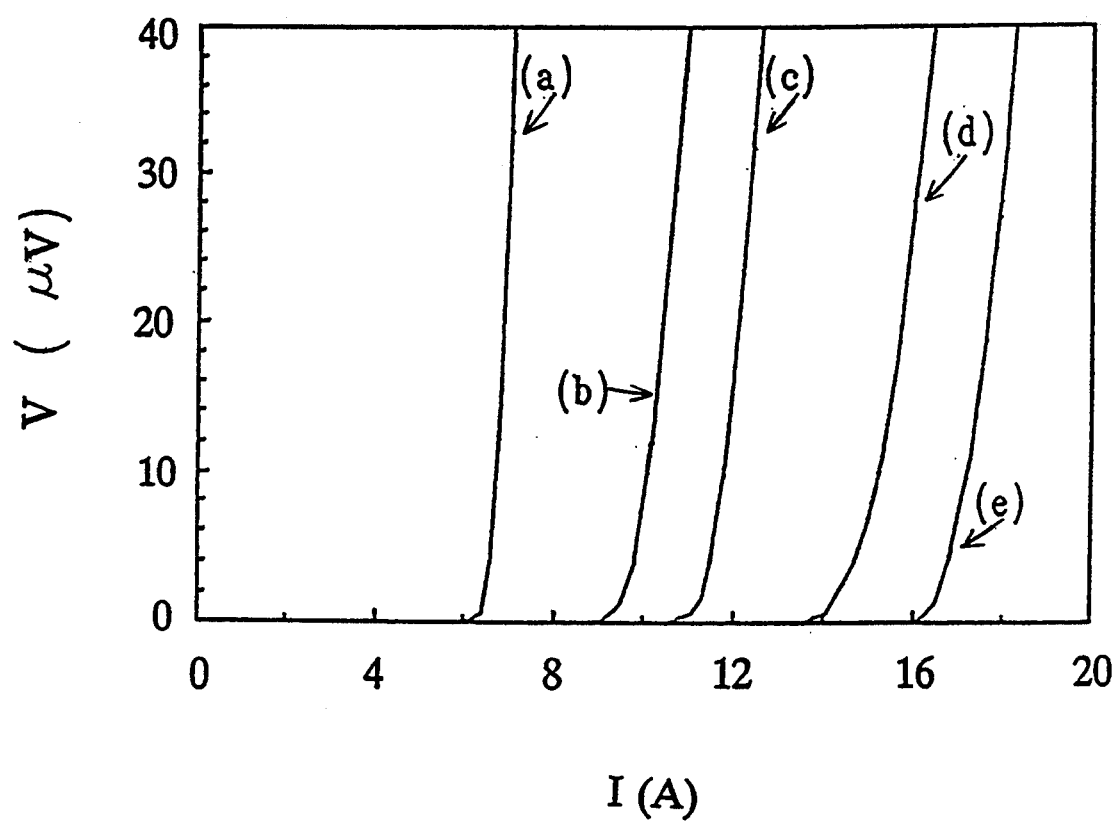
FIG. 3 shows the (electric) current-voltage relationships for five Tl-1223 superconducting tapes fabricated using five different processes, respectively: (a) one-stage single-sintering at 880° C. for 4 hours (FIG. 1A) for a tape that has been subject to a rolling step; (b) one-stage single-sintering at 910° C. for 5 hours (FIG. 1B) for a tape that has been subject to a rolling step; (c) two-stage single-sintering first at 910° C. for 1 hour then at 880° C. for 4 hour (FIG. 2) for a tape that has been subject to a rolling step; (d) same as in (c), except that the tape has been pressed once at 200 Kg/m$^2$ following the rolling step; (e) same as in (c), except that the tape has been pressed at 200 Kg/m$^2$ six times following the rolling step.
Figure 4:
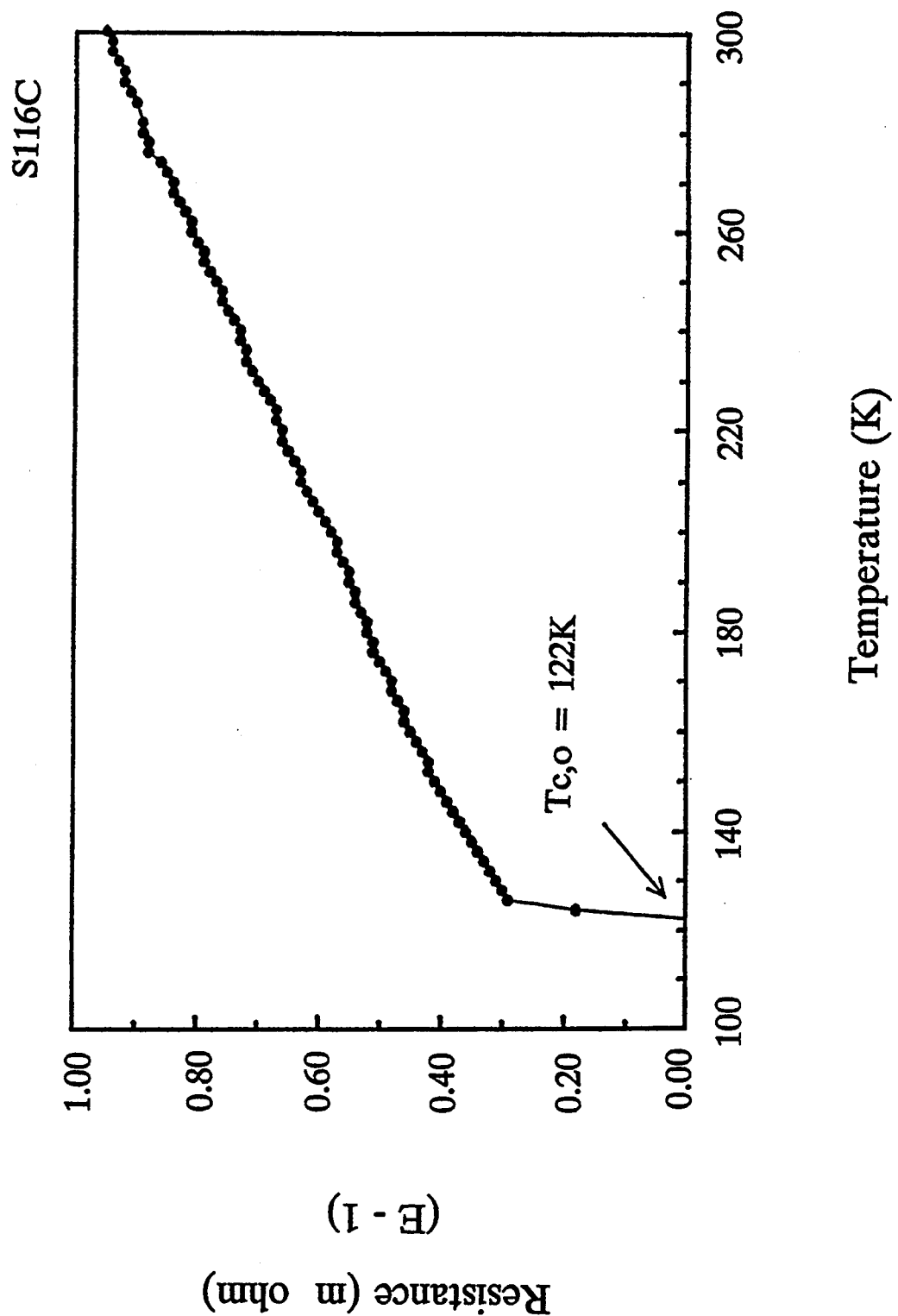
FIG. 4 shows the (electric) resistance-temperature relationship for a Tl-1223 superconducting tape fabricated using a two-stage single-sintering process, first at 910° C. for 1 hour then at 880° C. for 4 hours, of the present invention.

A voltage-current relationship was studied using a standard four-point probe method for the above fabricated Tl-1223 tape at 77K and 1 $\mu$V/cm, and the results obtained therefrom were shown in FIG. 3 (curve a). The Tl-1223 tape fabricated using the single-stage single-sintering process at 880° C. showed a critical current of less than 10 Ampere. This converts to a critical current density of less than 10,000 A/cm$^2$ (7,700 A/cm$^2$).

EXAMPLE 4

Fabrication of (Tl, Pb, Bi)(Sr, Ba)$_2Ca_2Cu_3O_y$ (Represented as Tl-1223) Tapes Using a Single-Stage Single-Sintering Process at 910° C.

The (Tl, Pb, Bi)(Sr, Ba)$_2Ca_2Cu_3O_y$ prepared from Example 2 was sintered using a single-stage single-sintering process as illustrated in FIG. 1A; initially the furnace temperature increased at a rate of about 5° C. per minute to 910° C., maintained at 910° C. for 5 hours, then was furnace-cooled to room temperature.

A voltage-current relationship was studied using a standard four-point probe method for the above fabricated Tl-1223 tape at 77K and 1 $\mu$V/cm, and the results obtained therefrom were shown in FIG. 3 (curve b). The Tl-1223 tape fabricated using the single-stage single-sintering process at 910° C. showed a critical current of less than 10 Ampere. This converts to a critical current density of less than 10,000 A/cm$^2$ (8,490 A/cm$^2$).

EXAMPLE 5

Fabrication of (Tl, Pb, Bi)(Sr, Ba)$_2Ca_2Cu_3O_y$ (Represented as Tl-1223) Tapes Using a Two-Stage Single-Sintering Process at 910° C.

Figure 2:
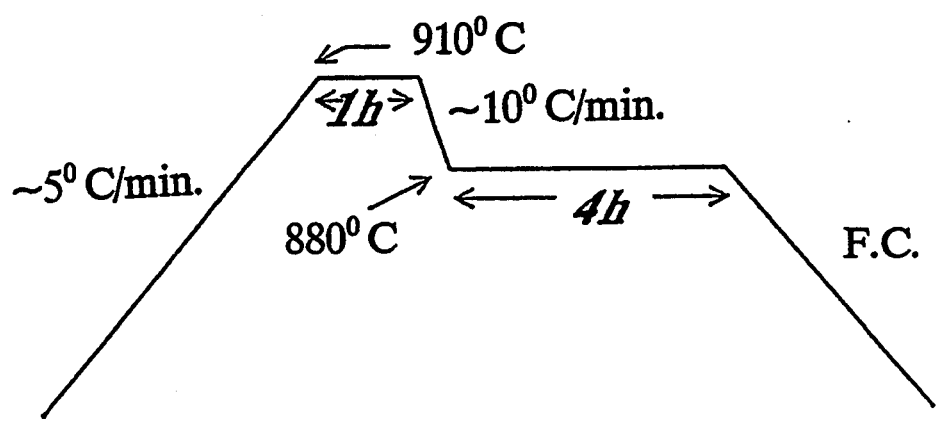
FIG. 2 shows the sintering temperature-time relationship in a two-stage, double-sintering process of the present invention for fabricating Tl-1223 superconducting tapes; initially the furnace temperature increased at a rate of about 5° C. per minute to 910° C., maintained at 910° C. for 1 hour, decreased at a rate of about 10° C. per minute to 880° C., maintained at 880° C. for four hours, then furnace-cooled to room temperature.

The (Tl, Pb, Bi)(Sr, Ba)$_2Ca_2Cu_3O_y$ prepared from Example 2 was sintered using a two-stage single-sintering process as illustrated in FIG. 2; initially the furnace temperature increased at a rate of about 5° C. per minute to 910° C., maintained at 910° C. for 1 hour, decreased at a rate of about 10° C. per minute to 880° C., maintained at 880° C. for four hours, then was furnace-cooled to room temperature.

A voltage-current relationship was studied using a standard four-point probe method for the above fabricated Tl-1223 tape at 77K and 1 $\mu$V/cm, and the results obtained therefrom were shown in FIG. 3 (curve c). The Tl-1223 tape fabricated using the two-stage single-sintering process at 910° C. and 880° C., respectively without interruption therebetween, showed a critical current exceeding 10 Ampere. This converts to a critical current density of greater than 10,000 A/cm$^2$ (10,500 A/cm2), an increase of about 2,500 A/cm$^2$ over the conventional method.

The Tl-1223 tape fabricated using the two-stage single-sintering process of the present invention exhibits a superior value of critical current density than the tapes fabricated by either the high temperature (910° C.) or low temperature (880° C.) conventional one-stage sintering process. The reason for such a substantial increase in the critical current density may be attributed to the fact that the first sintering temperature, i.e., 910° C., is close to the melting point of the Tl-1223 tape, and a portion of the Tl-1223 tape was in its liquid phase after the relatively short (1 hour) first stage of the two-stage one-sintering process of the present invention. During the cooler but relatively longer second stage of the two-stage single-sintering process, the liquid phase Tl-1223 acted as crystallization seeds to gradually form a stable phase. As a consequence, the two-stage one-sintering process is superior to either the high-temperature or the low-temperature one-stage one-sintering process.

Figure 5:
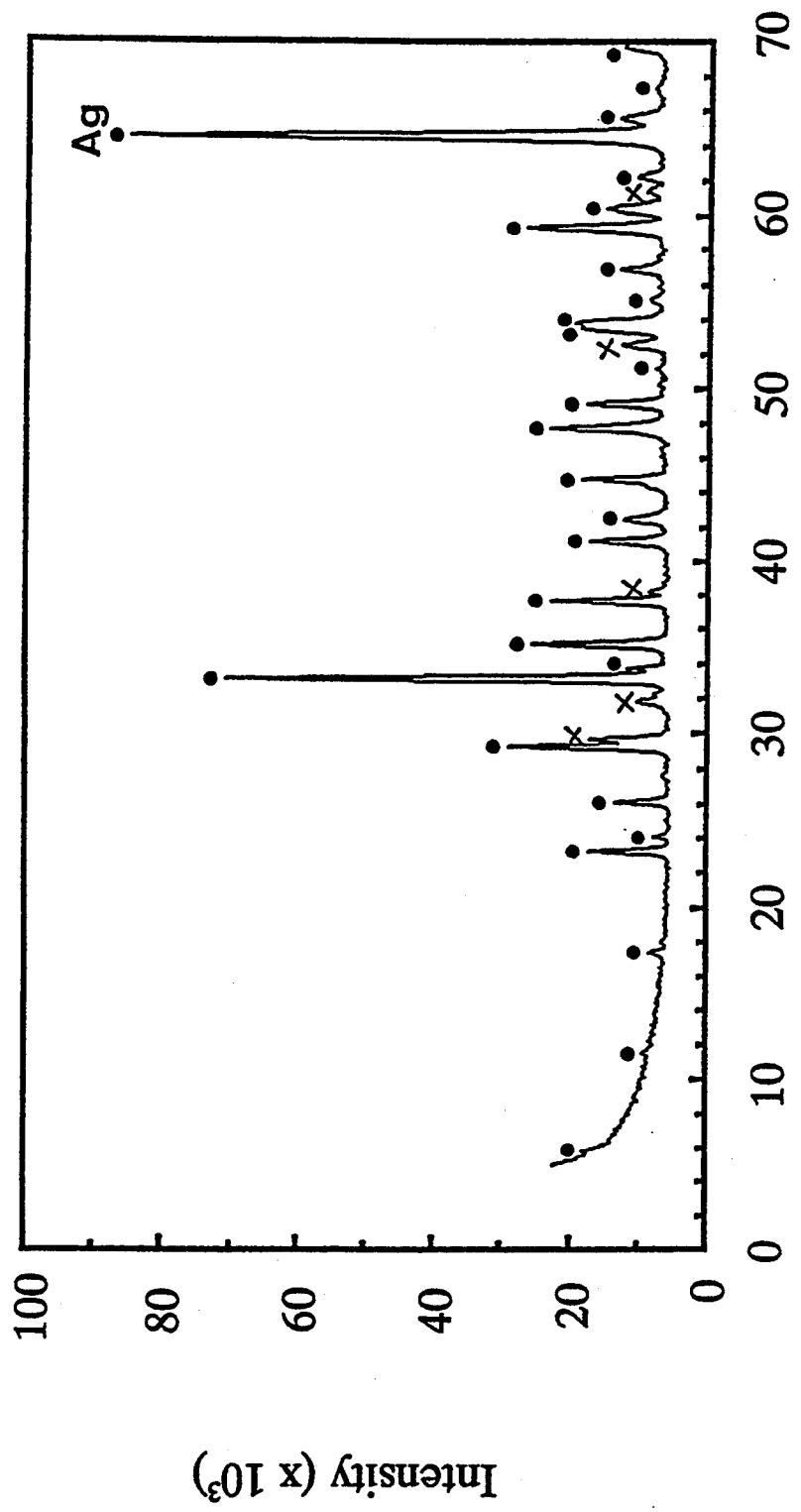
FIG. 5 shows the X-ray diffraction results from a Tl-1223 superconducting tape fabricated using a two-stage single-sintering process, first at 910° C. for 1 hour then at 880° C. for 4 hours, of the present invention (FIG. 3c); the results show that Tl-1223 (indicated as •) to be the major phase, with small amounts of impurities (indicated as X).

An X-ray diffraction study was done on the Tl-1223 superconducting tape obtained from this example, and the results, which are shown in FIG. 5, indicate that Tl-1223 (indicated as•) is the major phase, with small amounts of impurities (indicated as X).

EXAMPLE 6

Fabrication of (Tl, Pb, Bi)(Sr, Ba)$_2Ca_2Cu_3O_y$ (Represented as Tl-1223) Tapes Using a Two-Stage Single-Sintering Process at 910° C. and 880° C.

The procedure in fabricating the (Tl, Pb, Bi)(Sr, Ba)$_2Ca_2Cu_3O_y$ tape in Example 6 was identical to that in Example 5, except that the Tl-1223 tape had been pressed once under a stress of 200 Kg/m$^2$ prior to sintering. The Tl-1223 tape fabricated with a such a pre-sintering pressing step was measured to have a critical current of 13 Ampere (see FIG. 3, curve d), translating into a critical current density of 11,200 A/cm$^2$.

EXAMPLE 7 Fabrication of (Tl, Pb, Bi)(Sr, Ba)$_2Ca_2Cu_3O_y$ (Represented as Tl-1223) Tapes Using a Two-Stage Single-Sintering Process at 910° C. and 880° C.

The procedure in fabricating the (Tl, Pb, Bi)(Sr, Ba)$_2Ca_2Cu_3O_y$ tape in Example 7 was identical to that in Example 5, except that the Tl-1223 tape had been pressed six times under a stress of 200 Kg/m$^2$ prior to sintering. The Tl-1223 tape fabricated with a such a pre-sintering pressing step was measured to have a critical current of 16 Ampere (see FIG. 3, curve e), translating into a critical current density of 13,300 A/cm$^2$.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating Tl-based superconducting tape comprising the steps of:
    (a) preparing a powder mixture having a nominal composition of $(Tl_{1-x-y}Bi_xPb_y)(Ba_{2-z}Sr_z)Ca_2Cu_3O_9$, wherein x and y are real numbers between 2.0 and 0.4, and z is a real number between 0 and 2;
    (b) placing said powder mixture into a silver tube and drawing and/or swaging said silver tube containing said powder mixture into a wire having a predetermined diameter;
    (c) rolling said wire into a tape having a pre-determined thickness;
    (d) subjecting said tape to a two-stage single-sintering process, said two-stage single-sintering process comprising a first stage at first sintering temperature followed a second stage at a second sintering temperature, wherein said first sintering temperature is near the melting point temperature of said Tl-based superconducting tape, and said second sintering temperature is lower than said first sintering temperature.

2. The method for fabricating Tl-based superconducting tapes of claim 1 wherein said powder mixture having a molar ratio among the atoms of Tl:Bi:Pb:Sr:Ba:Ca:Cu equaling $0.4 \sim 0.6 : 0.2 \sim 0.4 : 0.2 \sim 0.4 : 1.2 \sim 1.9 : 0.8 \sim 0.1 : 2 : 3)$.

3. The method for fabricating Tl-based superconducting rapes of claim 1 wherein said powder mixture having a molar ratio among the atoms of Tl:Bi:Pb;Sr:Ba:Ca:Cu equaling $0.4 \sim 0.6 : 0.2 \sim 0.4 : 0.2 \sim 0.4 : 1.2 \sim 1.7 : 0.8 \sim 0.3 : 2 : 3)$.

4. The method for fabricating Tl-based super conducting tape of claim 1 wherein said two-stage single-sintering process comprises:
    (a) placing said Tl-based superconducting tape inside a furnace;
    (b) raising temperature of said furnace to said first sintering temperature of 890°~920° C.;
    (c) sintering said Tl-based superconducting tape at said first sintering temperature for 0.5~5 hours;
    (d) lowering temperature of said furnace to said second sintering temperature of 800°~880° C.; and
    (e) sintering said Tl-based superconducting tape at said second sintering temperature for 1~12 hours.

5. The method for fabricating Tl-based superconducting tape of claim 1 wherein said two-stage single-sintering process is conducted in an oxygen-containing environment.

6. The method for fabricating Tl-based superconducting tape of claim 1 which further comprises the step of pressing said Tl-based superconducting tape prior to said two-stage single-sintering process.

7. The method for fabricating Tl-based superconducting tape of claim 1 further comprises the step of pressing said Tl-based superconducting tape a plurality of times prior to said two-stage single-sintering process.

8. The method of fabricating Tl-based superconducting tape of claim 1 wherein said Tl-based superconducting tape has a critical current density of about 10,500 A/cm$^2$ @77K and 1 μV/cm, after said two-stage single-sintering step.

* * * * *